United States Patent
Golecki (10) Patent No.: US 7,950,149 B2
(45) Date of Patent: May 31, 2011

(54) MICROCHANNEL HEAT EXCHANGER FABRICATED BY WIRE ELECTRO-DISCHARGE MACHINING

(75) Inventor: Ilan Golecki, Parsippany, NJ (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 12/548,713

(22) Filed: Aug. 27, 2009

(65) Prior Publication Data

US 2009/0313829 A1    Dec. 24, 2009

Related U.S. Application Data (62) Division of application No. 11/036,556, filed on Jan. 14, 2005, now abandoned.

(51) Int. Cl.
*F28F 13/18* (2006.01)

(52) U.S. Cl. .......... 29/890.03; 29/890.039; 29/557; 205/640; 205/641; 205/642

(58) Field of Classification Search .......... 29/890.03, 29/890.039, 890.035, 557, 558; 205/640–642, 205/652
See application file for complete search history.

(56) References Cited

U.S. PATENT DOCUMENTS

| | | | |
|---|---|---|---|
| 4,053,969 A * | 10/1977 | Bayard | 29/890.039 |
| 4,573,067 A | 2/1986 | Tuckerman et al. | |
| 4,628,991 A | 12/1986 | Hsiao et al. | |
| 4,758,926 A | 7/1988 | Herrell et al. | |
| 4,894,709 A | 1/1990 | Phillips et al. | |
| 5,015,347 A * | 5/1991 | Kuwabara et al. | 205/641 |
| 5,099,910 A | 3/1992 | Walpole et al. | |
| 5,294,831 A | 3/1994 | Azar et al. | |
| 5,321,888 A * | 6/1994 | Nemes | 29/890.054 |
| 5,388,635 A | 2/1995 | Gruber et al. | |
| 5,658,515 A * | 8/1997 | Lee et al. | 264/219 |
| 5,692,558 A | 12/1997 | Hamilton et al. | |
| 5,714,228 A * | 2/1998 | Beckmeyer et al. | 428/118 |
| 6,138,352 A * | 10/2000 | Smith et al. | 29/890.03 |
| 6,360,561 B2 | 3/2002 | Allam et al. | |
| 6,422,307 B1 * | 7/2002 | Bhatti et al. | 165/185 |
| 6,675,875 B1 | 1/2004 | Vafai et al. | |
| 6,800,828 B2 | 10/2004 | Golicki | |
| 6,865,081 B2 | 3/2005 | Meyer et al. | |
| 6,907,921 B2 | 6/2005 | Insley et al. | |
| 2001/0047862 A1 | 12/2001 | Anderson et al. | |
| 2002/0011330 A1 * | 1/2002 | Insley et al. | 165/133 |
| 2002/0096497 A1 * | 7/2002 | Jariabek | 219/69.12 |
| 2002/0109970 A1 | 8/2002 | Yang et al. | |
| 2002/0139677 A1 * | 10/2002 | Golecki | 204/640 |
| 2004/0031592 A1 | 2/2004 | Mathias et al. | |

(Continued)

FOREIGN PATENT DOCUMENTS

WO    WO 2004/042303 A2    5/2004

*Primary Examiner* — David P Bryant
*Assistant Examiner* — Christopher Besler
(74) *Attorney, Agent, or Firm* — Robert Desmond, Esq.

(57) ABSTRACT

The present invention provides panels for a microchannel heat exchanger core wherein the panels may have greater than about 36 fins per inch of the panel. The microchannels of the panels may have an aspect ratio of at least about 10. Panels are also provided having microchannels and fins on one side of the panel or on opposite sides of the panel. Methods are also provided for machining the panels of the present invention.

12 Claims, 7 Drawing Sheets

U.S. PATENT DOCUMENTS

| | | |
|---|---|---|
| 2004/0068991 A1 | 4/2004 | Banney et al. |
| 2004/0099712 A1 | 5/2004 | Tonkovich et al. |
| 2004/0188066 A1* | 9/2004 | Upadhya et al. ............. 165/80.4 |
| 2004/0194941 A1 | 10/2004 | Larrieu et al. |
| 2004/0258885 A1* | 12/2004 | Kreutter et al. ............... 428/156 |
| 2006/0021744 A1 | 2/2006 | Vogel |

* cited by examiner

MICROCHANNEL HEAT EXCHANGER FABRICATED BY WIRE ELECTRO-DISCHARGE MACHINING

CROSS-REFERENCE TO RELATED APPLICATION

This is a divisional application of U.S. application Ser. No. 11/036,556, filed on Jan. 14, 2005.

BACKGROUND OF THE INVENTION

The present invention relates to heat exchangers and to electro-discharge machining processes. The present invention also relates to microchannel heat exchangers having a high aspect ratio and methods of making such heat exchangers.

Heat transfer and fluid flow in the microchannels of microchannel heat exchangers have wide practical applications in highly specialized fields such as aerospace, bioengineering, microfabricated fluidic systems, and microelectronics. Lately, microchannel heat exchangers have also been used by the automotive air conditioning industry. The advantage of the microchannel heat exchanger lies in its high heat transfer coefficient and significant potential in decreasing the weight and size of heat exchangers.

Compared with channels of normal size, microchannels have many heat transfer advantages. Since microchannels have an increased heat transfer surface area and a large surface-to-volume ratio, they provide a much higher heat transfer. The surface-to-volume ratio can be expressed as the aspect ratio, which is the ratio of the microchannel depth to the width. The higher the aspect ratio, the greater the surface-to-volume ratio of microchannel heat exchangers. This feature allows microchannel heat exchangers to become compact and lightweight. In addition, microchannel heat exchangers can support high heat flux with small temperature gradients. However, microchannels also have weaknesses, such as large pressure drop, high cost of manufacture, dirt clogging, and flow mal-distribution, especially for two-phase flows. These weaknesses become more prevalent as the aspect ratio and the density of microchannels, and thus the efficiency, of microchannel heat exchangers increases.

For example, U.S. Patent Application Publication No. 2004/0031592 describes a microchannel heat exchanger having a maximum of only 21 fins per inch, the fins being the walls separating discrete microchannels. The aspect ratio of the microchannels of the patent application 2004/0031592 is less than 10. Moreover, the microchannel heat exchanger is made from a dense steel alloy which allows for stronger fins and thus more microchannels per inch. However, as well as becoming more compact, it is desirable to have microchannel heat exchangers that are made of lighter materials.

In another example, U.S. Patent Application Publication No. 2004/0099712 describes microchannel heat exchangers and microreactors having about 25 fins per inch and an aspect ratio of less than 1. They are also made of heavy, dense material such as stainless steel. These microchannel heat exchangers and microreactors would not provide optimal cooling because of the number of fins and low aspect ratio.

As can be seen, there is a need for compact microchannel heat exchangers having a high density of fins per inch as well as a high aspect ratio. It also would be desirable if such compact microchannel heat exchangers were made of a lighter, less dense material than steel alloys. There is also a need for a relatively simple and low-cost manufacturing method for such compact microchannel heat exchangers.

SUMMARY OF THE INVENTION

In another aspect of the present invention there is provided a method of machining a panel, comprising the steps of applying a voltage to at least one electrode; moving the electrode downward into one side of the panel to a desired depth, wherein a microchannel is formed in the panel; discontinuing application of the voltage to the electrode; and thereafter, moving the electrode upward out of the panel.

In yet another aspect of the present invention there is provided a method of machining a panel for a microchannel heat exchanger comprising applying a voltage to at least one electrode; performing electrical discharge machining of a plurality of microchannels and fins on the panel using the electrode, wherein the fins separate the microchannels by providing walls and wherein the microchannels have an aspect ratio of depth to width of at least about 10; and etching the microchannels.

In a further aspect of the present invention there is provided a method of making a microchannel heat exchanger core comprising the steps of applying a voltage to at least one electrode; performing electrical discharge machining of a plurality of microchannels and fins on at least two panels using the electrode to provide machined panels, wherein the fins separate the microchannels by providing walls for the microchannels and wherein the microchannels have an aspect ratio of depth to width of at least about 10; etching the microchannels of the machined panels; arranging the machined panels one on top of the other; and joining the panels together by brazing, welding or gasketing.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention provides a microchannel heat exchanger, and a method for forming a microchannel heat exchanger using an electro-discharge machining (EDM) process. A panel for a microchannel heat exchanger core of the present invention may comprise a plurality of microchannels and fins. The microchannels may be formed between the fins, the fins providing walls for the microchannels. More specifically, the panel of the present invention may have greater than about 36 fins per inch, and the microchannels may have an aspect ratio of depth to width of at least about 10. The high number of fins per unit width of the panel, and therefore the high number of microchannels, as well as the high aspect ratio of each microchannel may provide for more effective heat exchange by increasing the surface-to-volume ratio of the microchannel heat exchanger core. This increased efficiency may be important in many applications which may require compact heat exchangers with high heat transfer efficiencies. Microchannel heat exchanger cores having the panels of the present invention may be used in applications such as, but not limited to, aircraft environmental control systems, microelectronics, small combustors, and chemical microreactors. Alternatively, the panels of the present invention may be used as cold plates, heat sinks, and heat spreaders.

There has been an increased need for more compact, lighter weight and highly efficient microchannel heat exchangers. The panels of the present invention, when used in microchannel heat exchangers, may provide those needs. The panels may have a high surface-to-volume ratio which may be a product of having at least about 36 fins or microchannels per inch where the microchannels have an aspect ratio of at least about 10. The panels of the present invention may be fabricated in an aluminum alloy, a stainless steel alloy, a copper alloy, a titanium alloy, an iridium alloy, a rhodium alloy, graphite, a carbon-carbon fiber matrix composite, a carbon-silicon composite, an aluminum-silicon carbide composite, boron carbide, titanium carbide or titanium nitride. For example, the panels of the present invention may be fabricated in any one of many aluminum alloys, which have relatively low density and high thermal conductivity. Alternatively, the panels may be fabricated in higher elastic modulus metals with densities lower than those of stainless steels, such as, but not limited to, titanium alloys. Additionally, such panels may be fabricated in even higher modulus metals, such as, iridium alloys and rhodium alloys. Iridium, rhodium and their alloys may have higher temperature capabilities and may be inert to many aggressive chemicals. In contrast, the panels of the prior art are made of stainless steel and have aspect ratios of less than 10 and a fin density of less than 30 fins per inch.

High elastic modulus metals may be difficult or impossible to form into fin and microchannel panels by folding or stamping, which are commonly used techniques in the prior art to make heat exchanger cores. The panels of the present invention may be made by a process which may comprise electrical discharge machining (EDM) which may provide a high number of microchannels per inch with a greater aspect ratio. In the EDM process of the present invention, electrical voltage may be applied to a wire electrode only during the downward movement of the wire electrode, and electrical power may be turned off as the wire is moved upward and out of the newly formed microchannel. Alternately, voltages may be applied to the electrode during both plunge-in and outward portions of travel. It has been found during the course of this invention that in certain instances, it may be advantageous to power the electrode only during downward travel, so as to reduce or even substantially eliminate systematic tilt of the fins observed when said electrode was powered throughout the travel. The process may optionally further comprise etching, e.g., chemical etching, of microchannels formed by EDM.

Figure 1:
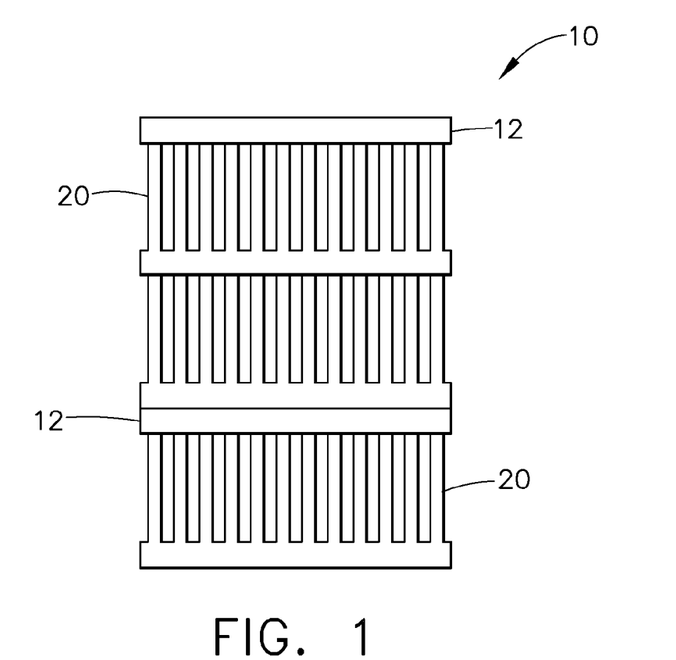
FIG. 1 is a plan view of a microchannel heat exchanger, according to the invention.

Illustrated in FIG. 1 is a microchannel heat exchanger core 10 which may comprise panels 20. Panels 20 may be joined together to form a microchannel heat exchanger core by methods that provide leak-proof joints, such as, but not limited to, brazing, welding and gasketing. Microchannel heat exchanger core 10 may further comprise parting sheets 12 placed in between panels 20 before they are joined together. The material may be the same or it may be different from the material of panels 20. Panels 20 may have the same number of fins 26 per inch (see, e.g., FIG. 2), or each panel 20 may have a different number of fins 26 per inch. Likewise, panels 20 may have microchannels 28 (see, e.g., FIG. 2), which may have the same dimensions and/or aspect ratio, or each panel 20 may have microchannels 28 with different dimensions and/or aspect ratios. In one embodiment of the invention, microchannel heat exchanger core 10 may comprise panels 20 arranged one on top of the other with microchannels 28 from a first panel 20 running in the same direction as microchannels 28 from other panels 20 in microchannel heat exchanger core 10. In an alternative embodiment, panels 20 may be arranged one on top of the other such that microchannels 28 of a first panel 20 may be substantially perpendicular to microchannels 28 of the next panel 20 in microchannel heat exchanger core 10, wherein substantially perpendicular may be about 90 degrees±5 degrees. More generally, alternate panels 20 in the core may be arranged at arbitrary angles to each other. The dimensions of panels 20 may be dependent on the desired dimensions of microchannel heat exchanger core 10 and/or the method by which they are manufactured. For example, if panels 20 are made using electrical discharge machining, the length of panel 20 may depend on the length of a wire electrode. By way of non-limiting example, the length of panel 20 may be from about 1.0 inches to about 4.5 inches.

Figure 2:
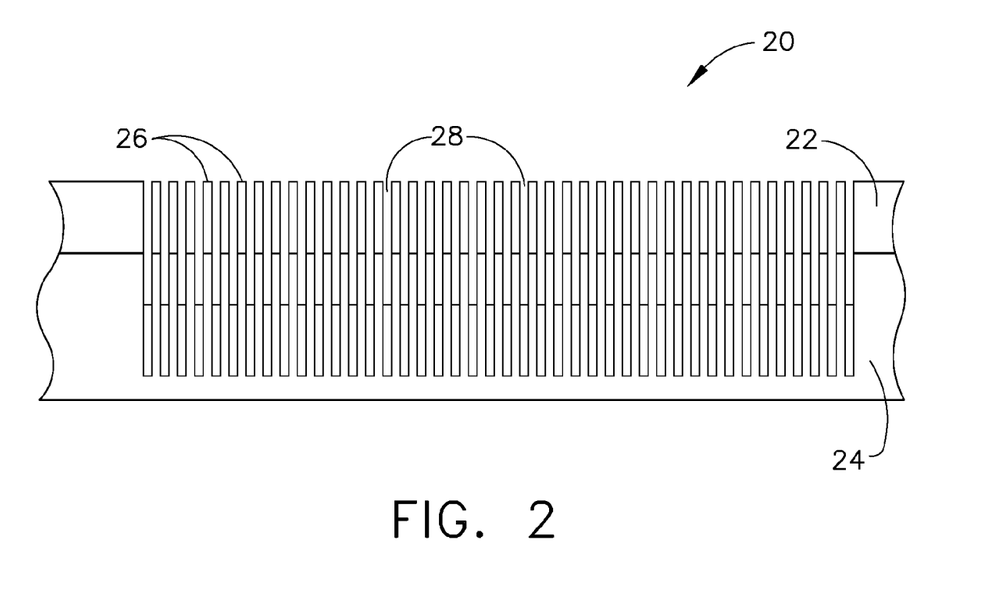
FIG. 2 is a perspective view of a panel of a microchannel heat exchanger having 40 fins per inch, according to the invention.
Figure 3:
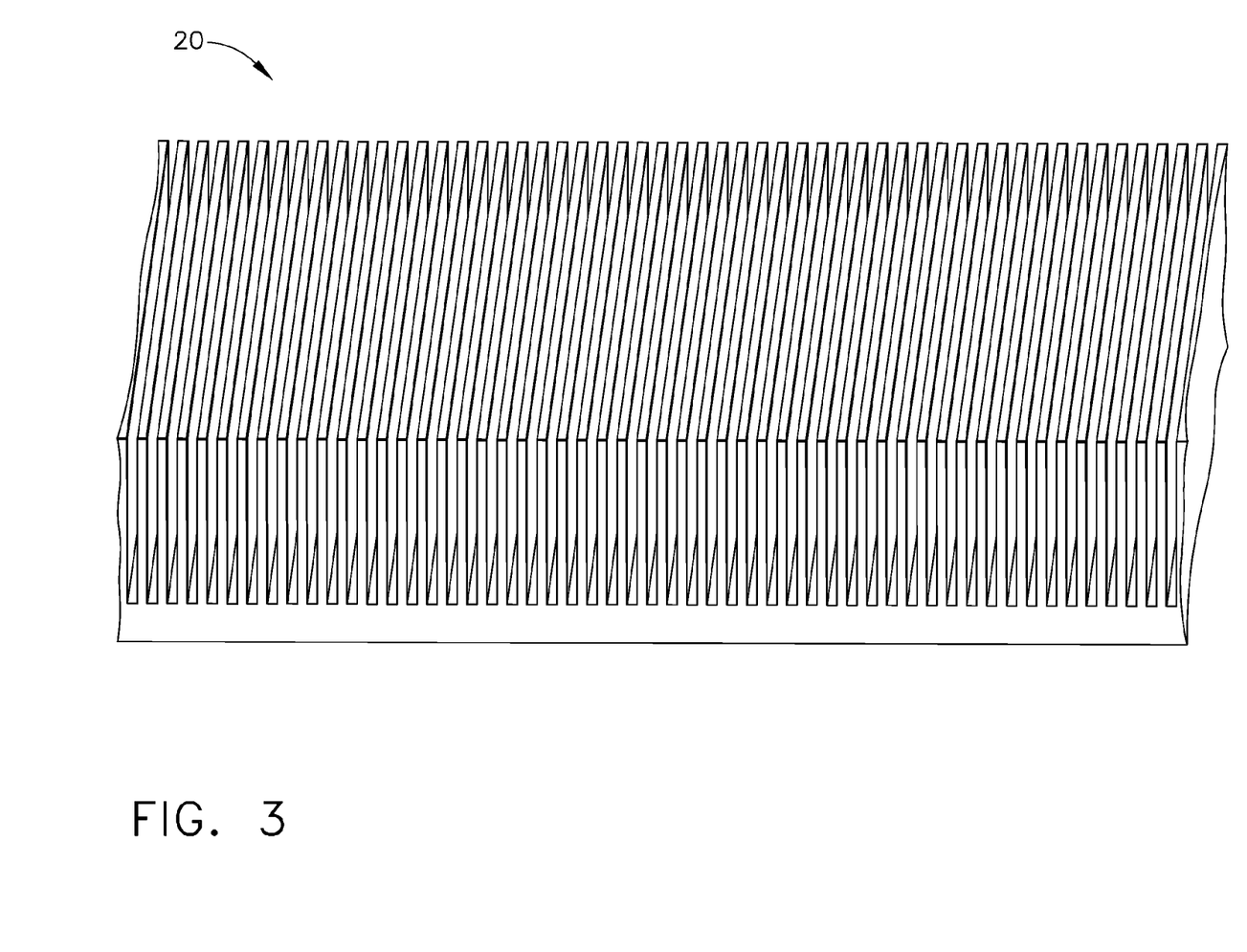
FIG. 3 is a perspective view of a panel of a microchannel heat exchanger having 76 fins per inch, according to the invention.
Figure 4:
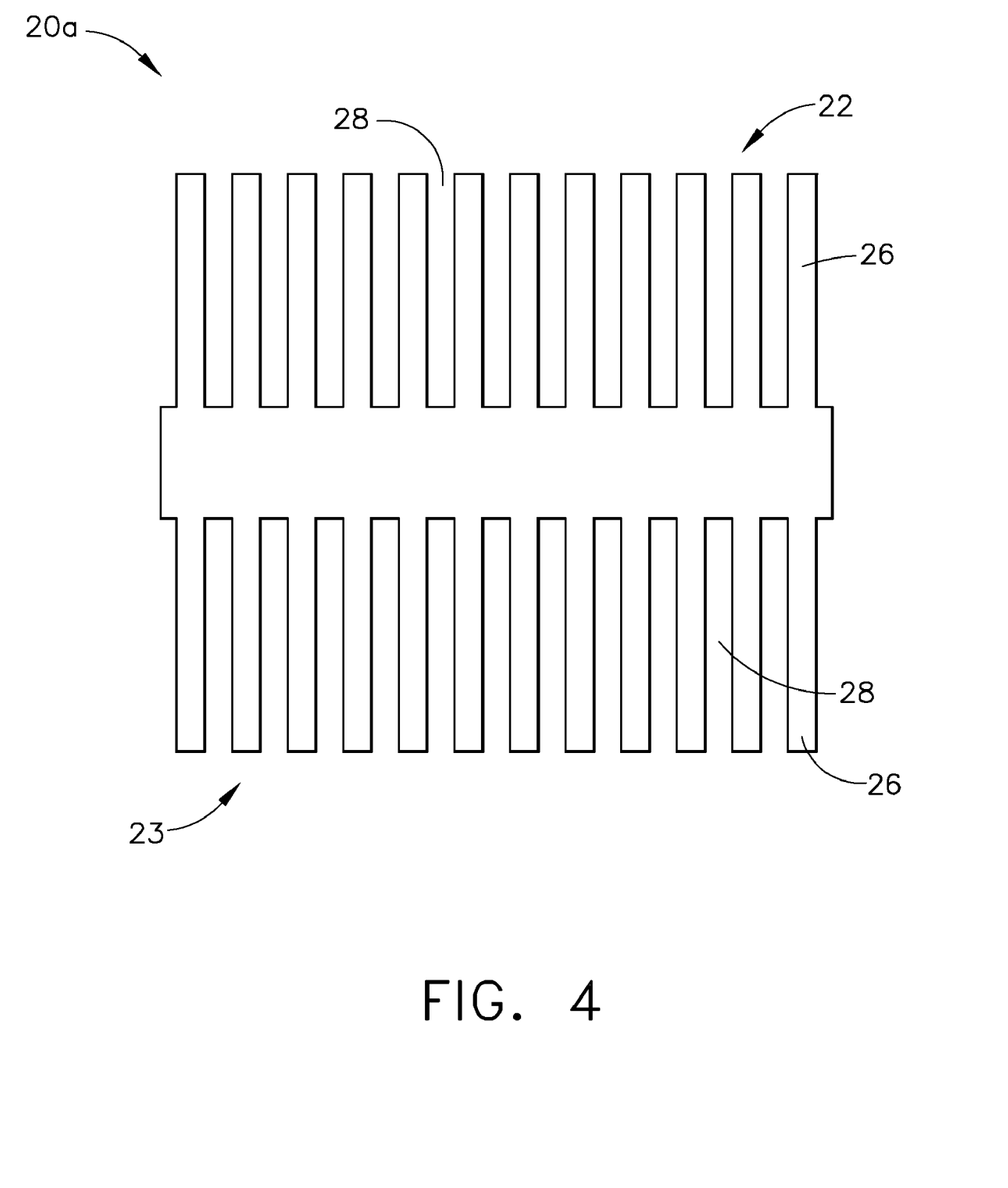
FIG. 4 is a side view of a duplex panel of a microchannel heat exchanger, according to the invention.
Figure 5:
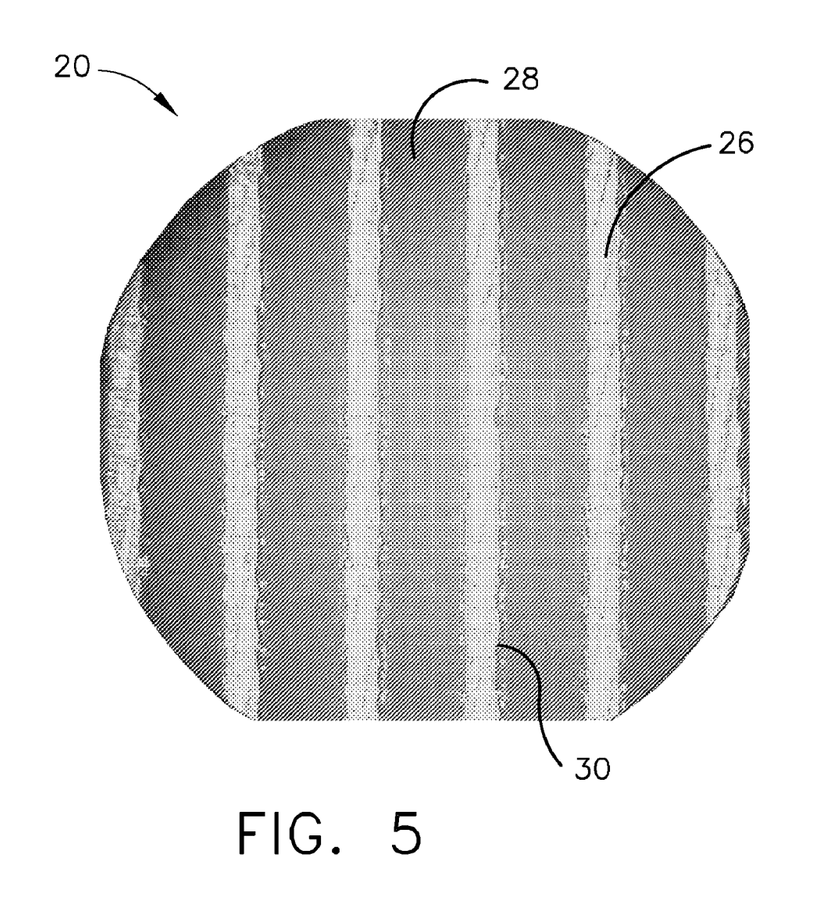
FIG. 5 is a top view of the microchannels of the panel of FIG. 2, according to the invention.
Figure 6:
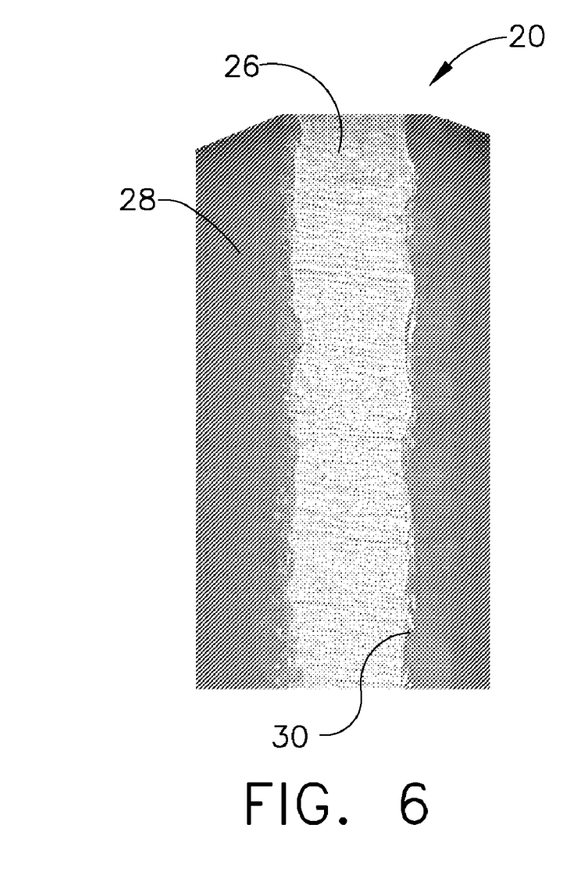
FIG. 6 is an expanded top view of a wall of the microchannel of FIG. 5, according to the invention.

Panel 20 is shown in greater detail in FIGS. 2, 3 and 4. Panel 20 may comprise a top side 22 and a bottom side 23 (see FIG. 4) opposite the top side 22. Microchannels 28 of each panel 20 may be separated by fins 26, which may provide the walls for microchannels 28. In one embodiment, panel 20 may comprise microchannels 28 and fins 26 on one side of panel 20. This embodiment is illustrated in FIGS. 2 and 3. In an alternative embodiment, as illustrated in FIG. 4, panel 20a may comprise a duplex geometry where microchannels 28 and fins 26 may be on opposite sides of panel 20, i.e. on the top side 22 and the bottom side 23. The number of fins 26 per inch may be the same for each side of the duplex panel 20a, or they may be different. Likewise, the aspect ratios of microchannels 28 may be the same or different for each side of the duplex panel 20a. Additionally, the relative angular orientation of the microchannels 28 on each side of the duplex panel 20a may be chosen to equal any value from 0 to 90 degrees, where 0 degrees represents a parallel relationship and 90 degrees represents a perpendicular relationship.

FIGS. 2, 3 and 5-9 show examples of panel 20, having a high density of fins 26 per inch according to the invention. Panel 20 in FIG. 2 is a non-limiting example of a panel 20 having 40 microchannels 28 per inch, while panel 20 in FIG. 3 is a non-limiting example of a panel 20 having 76 microchannels 28 per inch. As the density of fins 26 increases, there may be more wall surface 30 of microchannels 28, resulting in increased surface area of panels 20 and 20a and efficiency of heat exchange. As the number of fins 26 per inch increases, with a corresponding increase in the number of microchannels 28 per inch, the surface area per unit length of panels 20 and 20a may increase. In one illustrative embodiment, panels 20 and 20a may have greater than 36 fins 26 per inch. In another illustrative embodiment, panels 20 and 20a may have from about 40 to about 110 fins 26 per inch. In a further illustrative embodiment, panels 20 and 20a may have from about 50 to about 80 fins 26 per inch. In a final illustrative embodiment, panels 20 and 20a may have from about 40 to about 60 fins 26 per inch or from about 60 fins per inch to about 80 fins 26 per inch. In practicality, the density of fins 26 may be limited only by the material panels 20 and 20a may comprise and how thin fins 26 may be and still retain the strength required to keep the structural integrity of panels 20 and 20a. In one illustrative embodiment, fins 26 have a thickness of from about 0.0015 inches to about 0.009 inches.

The density of fins 26 may be directly related to the dimensions of microchannels 28 and vice versa. As the density of fins 26 increases, the width of microchannels 28 may decrease. By way of non-limiting example, panels 20 and 20a may comprise 40 fins 26 per inch and may have microchannels 28 with a width of about 0.0162 inches, while another panel 20 or 20a may comprise 76 fins 26 per inch and may have microchannels 28 with a width of 0.009 inches. Increasing the density of fins 26 may increase the total surface area of panels 20 and 20a, which may result in increased heat exchange efficiency of panels 20 and 20a.

In one illustrative embodiment, microchannels 28 of panels 20 and 20a of the present invention may have a depth of from about 0.125 inches to about 0.500 inches and a width of from about 0.009 inches to about 0.0165 inches. One measure of heating efficiency may be an aspect ratio of microchannels 28 where the aspect ratio may be defined as the ratio of the depth to the width of a microchannel 28. As the aspect ratio increases, the efficiency of heat exchange may also increase. In one embodiment, the aspect ratio for microchannels 28 of panels 20 and 20a may be at least about 10. In an illustrative embodiment, the aspect ratio may be from about 10 to about 100. In another illustrative embodiment, the aspect ratio may be from about 10 to about 40. In a further illustrative embodiment, the aspect ratio may be from about 10 to about 20 or from about 15 to about 30.

Figure 7A:
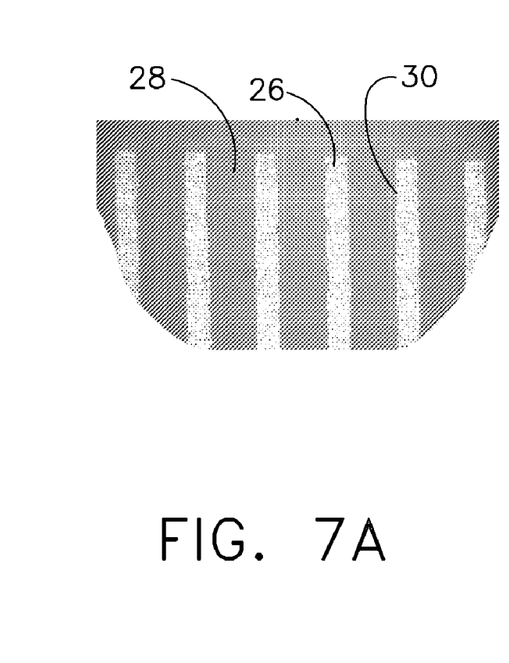
FIG. 7A is a cross-sectional view of the top portion of the panel of FIG. 2, according to the invention.
Figure 7B:
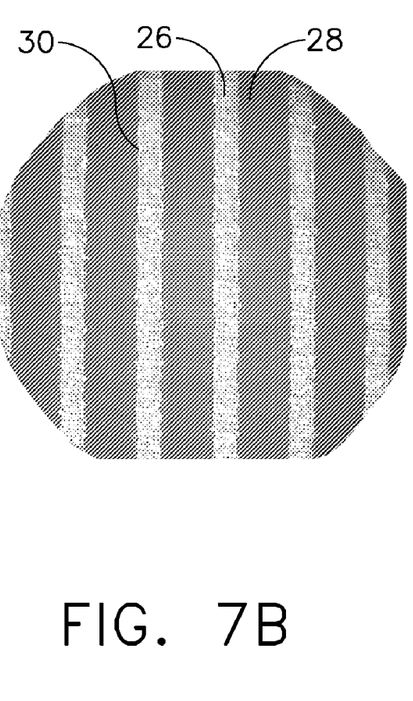
FIG. 7B is a cross-sectional view of the middle portion of the panel of FIG. 2, according to the invention.
Figure 7C:
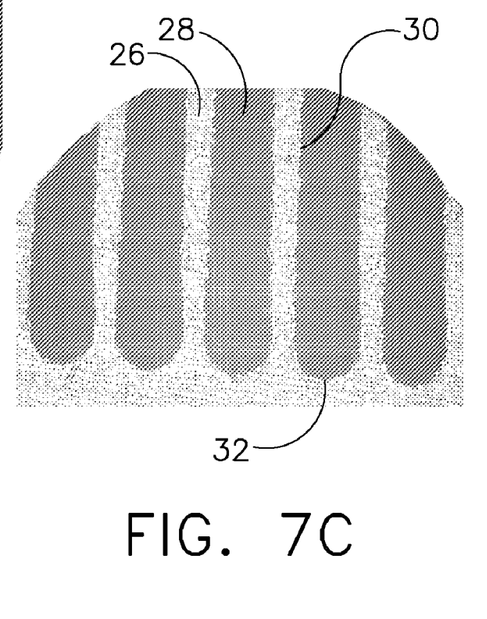
FIG. 7C is a cross-sectional view of the bottom portion of the panel of FIG. 2, according to the invention.
Figure 8:
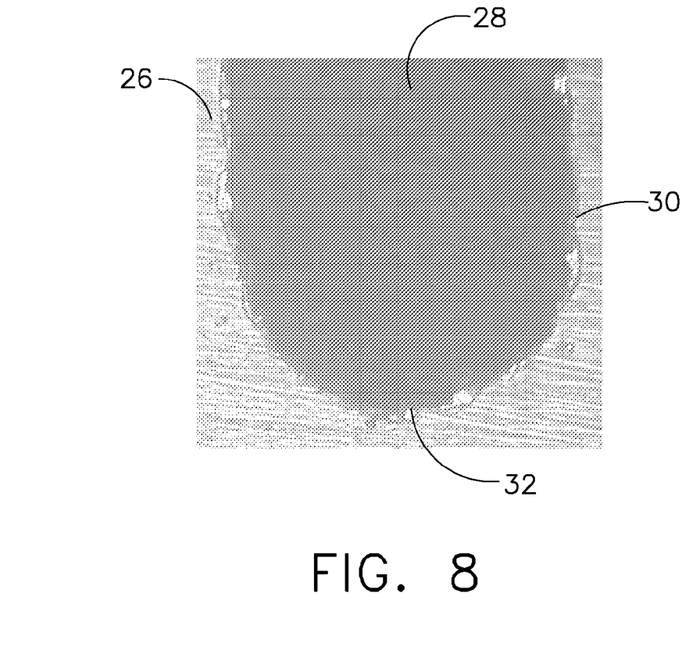
FIG. 8 is an expanded cross-sectional view of the bottom portion of a microchannel of FIG. 7C, according to the invention.
Figure 9:
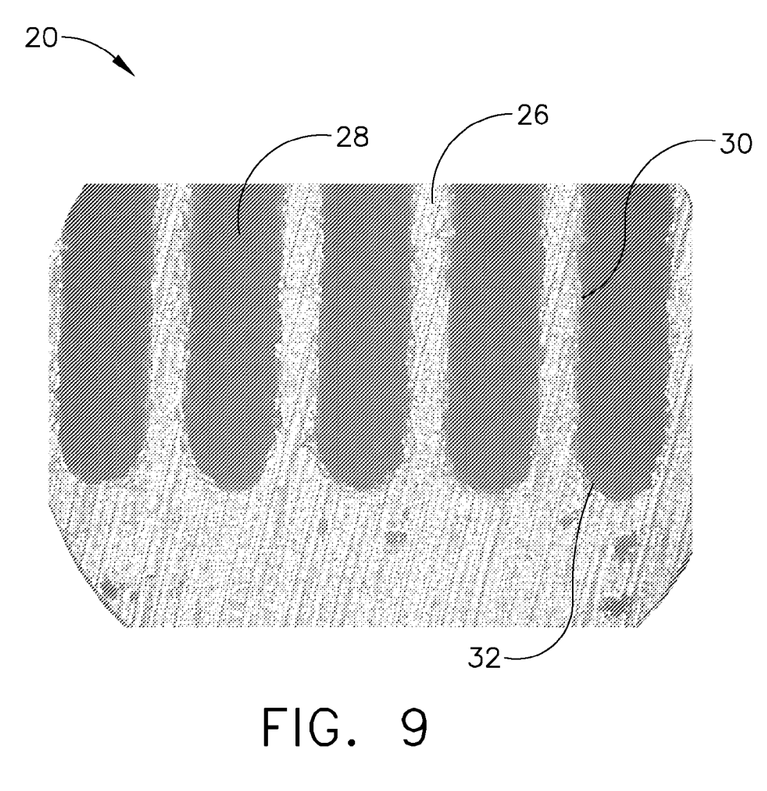
FIG. 9 is an expanded cross-sectional view of the bottom of the microchannels of the panel of FIG. 3, according to the invention.

The shape of microchannel 28 may also affect the efficiency of heat exchange and/or the weight of panels 20 and 20a. As illustrated in FIGS. 5-9, microchannels 28 may be separated by fins 26 where the fins 26 may comprise wall surfaces 30. In a first embodiment, wall surfaces 30 may be parallel to one another and fins 26 may have a substantially constant thickness. It should be noted that wall surfaces 30 may be part of both fins 26 and microchannels 28. Alternatively, the wall surfaces 30 may not be parallel to one another, and the thickness of fins 26 may vary. In a second embodiment, the thickness of fins 26 may increase with increasing depth, reaching a maximum at a bottom surface 32 of microchannel 28. The wall surfaces 30 may then converge at the bottom surface 32 forming a pointed, or triangular, bottom surface (not shown) as opposed to a rounded bottom surface 32 as shown in FIGS. 7C, 8 and 9. Conversely, in a third embodiment, the thickness of fins 26 may decrease downward, forming a microchannel having a narrower width toward the top surface 22 of panel 20 and a wider width at bottom surface 32. It should be understood that intermediate designs of fin 26 thickness vs. depth are also contemplated in the present invention, i.e. designs where the fin 26 thickness varies in a complex pre-determined way with depth. In one illustrative embodiment, the shape of the microchannels in FIGS. 5-9 where the width of microchannels 28 and fins 26 may be constant may be, particularly in certain applications where a fluid flows through microchannels 28, considered advantageous in maintaining constant flow dimensions as a function of microchannel depth. Furthermore, this shape may reduce or even prevent fouling or accumulation of debris within microchannels 28 with increasing use over time.

The geometry of bottom surface 32 of microchannel 28 may vary. By way of non-limiting example, the bottom surface 32 may be rounded, rectangular or triangular in cross-section. The examples illustrated in FIGS. 7C, 8 and 9 show a rounded bottom surface 32. In an illustrative embodiment, the radii of microchannels 28 may be from about 0.005 inches to about 0.012 inches. The desired shape of bottom surface 32 may depend on the application. Having a rounded, controlled radius as bottom surface 32, rather than a rectangular or triangular geometry with sharp corners, may be considered desirable both in terms of reducing fouling and/or in terms of flow characteristics.

Panels 20 and 20a may comprise a thermally conductive material. The panel material may have a low density (i.e., may be lightweight) and may be inert to oxidation and/or aggressive chemicals. By way of non-limiting example, the material may be aluminum alloys, stainless steel alloys, copper alloys, titanium alloys, iridium alloys, rhodium alloys, graphite, carbon-carbon fiber matrix composites, carbon-silicon composites, aluminum-silicon carbide composites, boron carbide, titanium carbide or titanium nitride.

Figure 10:
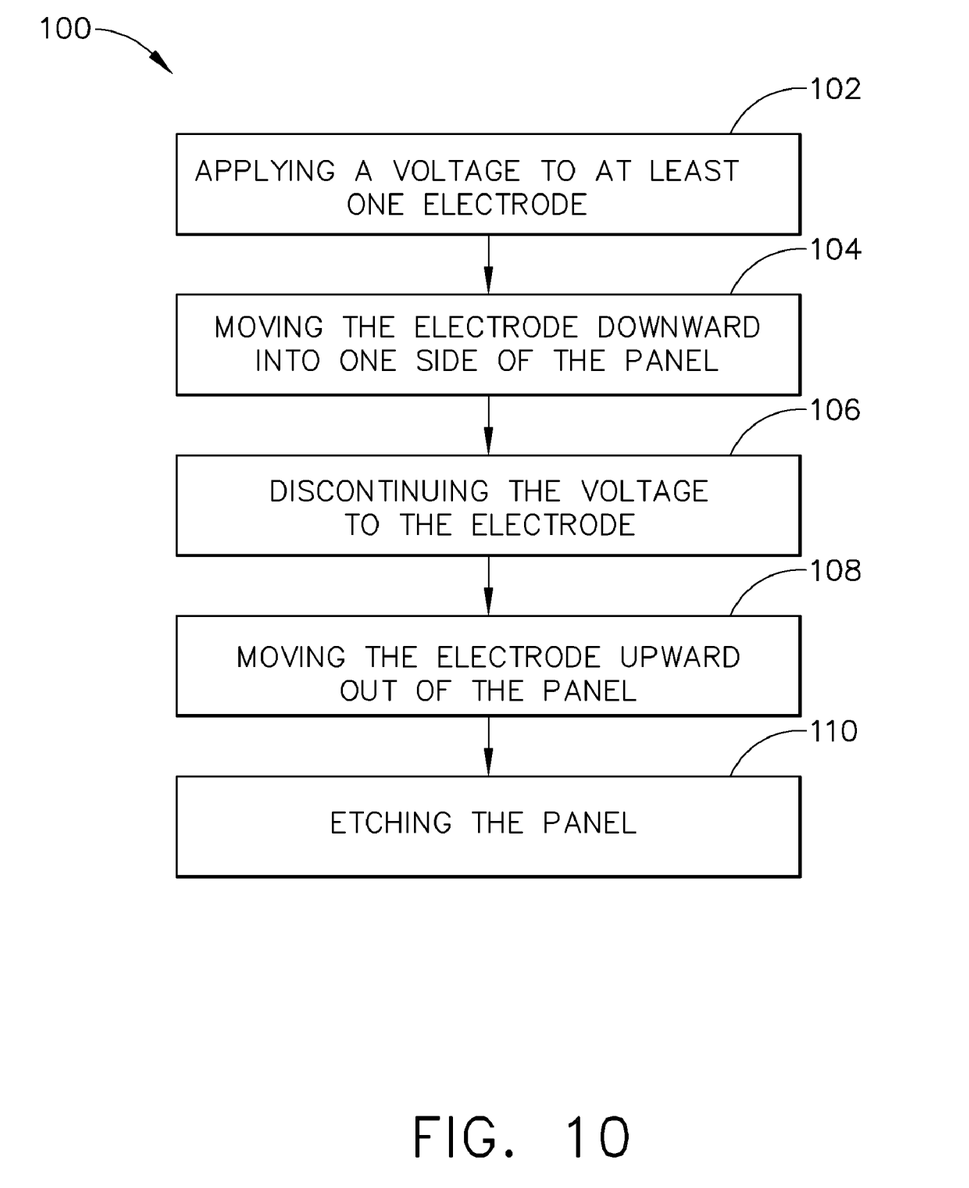
FIG. 10 is a flow chart showing a method of making a microchannel heat exchanger core, according to the invention.

The panels 20 and 20a of the present invention may be formed by electrical discharge machining (EDM). EDM may be used to remove portions of panel material by spark erosion, as is generally known in the art. FIG. 10 illustrates a method 100 for machining a panel for a microchannel heat exchanger core using EDM. Method 100 may comprise step 102 of applying a voltage to at least one electrode, step 104 of moving the electrode downward into one side of the panel to a desired depth to form a microchannel, step 106 of discontinuing the voltage to the electrode, and step 108 of moving the electrode upward out of the panel. Method 100 may optionally further comprise step 110 of etching a microchannel formed in the panel material during step 104 by EDM. Alternatively, step 106 may be omitted from method 100.

In method 100, during EDM an electrode may be brought in close proximity to the panel, which constitutes a second electrode. As a voltage is applied to the electrode, an electrical current pulse may be generated between the electrode and the panel. In one illustrative embodiment, currents may be in the range of 0.1 amps to 100 amps, and voltages may be in the range of 1 volt to 100 volts. In a further illustrative embodiment, current is pulsed, with pulse duration being in the range of 1 microsecond to 1000 microseconds. The electrical pulses may result in a concentrated amount of energy being deposited in the region of the panel under the wire electrode, which results in heating and vaporization removal of material from the panel.

In another embodiment of the invention, a first voltage may be applied to at least one electrode. The electrode may then be moved downward into one side of the panel to a desired depth to form a microchannel. After the desired depth is reached, the applied voltage may be changed to a second voltage and the electrode may be moved sideways by a predetermined amount. Finally, the applied voltage may be changed to a third voltage the electrode moved upward out of the panel. It will be appreciated that additional voltages and movements of the electrode may be added to the above sequence.

During EDM, a dielectric such as water or oil (either as a liquid, initially, or a vapor) may be supplied to the panel. An inert gas such as argon or nitrogen may be used instead.

In one embodiment of the present invention, the electrode may be a wire electrode. Dimensions of the wire electrode may depend upon the details to be machined and the composition of the electrode. In one illustrative embodiment, the wire electrode may have a diameter of from about 0.001 inches to about 0.012 inches. In an alternative embodiment, the electrode may be a small diameter rod. The rod may have various cross-sections, such as, but not limited to, round, elliptical, square, rectangular or triangular. In one illustrative embodiment, the rod may have a round cross-section with a diameter of from about 0.008 inches to about 0.010 inches.

In method 100, each microchannel of the panel may be machined in sequence. In an illustrative embodiment, each microchannel may be machined in sequence, without interruption, under automatic computer control. Alternatively, each of the microchannels of the panel may be machined concurrently. In an alternative illustrative embodiment, an array of rods may be used as electrodes.

In EDM processes of the prior art, electrical voltage is applied to the electrode continuously during the whole process, including as the electrode moves downward into a workpiece as well as when it is subsequently moved back upward to remove it from the workpiece. In the case of heat exchanger panels, this may result in undesirable deformation, for example tilting of the fins as well as excessive removal of material from the panel. In some embodiments of the method of the present invention, the voltage may only be applied to the electrode during its downward movement into the panel. After the desired depth is reached, the voltage may be turned off before the electrode moves upward, out of the microchannel. This may be advantageous in reducing the amount of heat and shock imparted to the microchannels and fins by about 50% during machining. Reducing the heat and shock may provide microchannels which may have straighter walls and fins. Additionally, the walls of the microchannel may have reduced surface roughness. Surface roughness of the walls can be controlled by wire EDM process conditions.

If the widths of the microchannels and thicknesses of the fins obtained by wire EDM are respectively smaller and larger than the desired final dimensions, the microchannel widths may be increased and fin thicknesses decreased by additional machining with chemical or electrochemical etching, and/or by using laser ablation. For example, laser ablation may be with a nanosecond or femtosecond pulsed Nd-YAG laser. Additionally, this machining or etching may be used to further control surface morphology and roughness, engineering desired morphologies and roughness levels in the heat exchanger component.

Chemical etching, both liquid and vapor, may be used in step 110 of method 100. Etching chemistry, composition, concentration, pH level and temperature may be chosen appropriately depending on the composition of the panel material. By way of illustrative example, when using liquid etching, both acidic solutions, such as, but not limited to, hydrochloric acid, and basic solutions, such as, but not limited to potassium hydroxide, are effective in removing aluminum. In one illustrative embodiment, basic solutions such as potassium hydroxide, may be used due to a more uniform resultant surface morphology, less deep pitting, and a relatively constant etch rate as a function of time, enabling better practical control of the etching process. In another illustrative embodiment, etching with a dilute potassium hydroxide solution at nominally room temperature, a substantially uniform etch rate may be measured on a wire EDM machined microchannel and fin structure in aluminum 6061 alloy. That is, comparison of pre-etch and post-etch dimensions of the microchannels, fins and other structures showed that the amount of aluminum alloy removed may be substantially the same at different locations within the structure. In a further illustrative embodiment, the dilute KOH may have a concentration of about 5% to about 20% by weight in a solvent such as, but not limited to, methanol or an aqueous solvent such as water. Chemical etching may be performed with or without concurrent sonication or agitation. Additionally, following the etching step, an immersion of the aluminum alloy structure in deionized water with optional agitation may be used to control the visual appearance of such etched structure, for example, to change the surface appearance from dark to light/silvery.

Chemical etching may also be done using chemical vapor. The panel may be placed in a vacuum chamber and the air removed before etching. The chemical vapor may comprise, by way of non-limiting example, silicon fluorocarbons, hydrofluorocarbons, nitrogen trifluoride, silicon fluoride, hydrochlorocarbons or nitrofluorocarbons.

Wire EDM may fabricate microchannel widths and fin thicknesses which are constant with microchannel depth or which change with microchannel depth in some controlled fashion, for example fin thickness which increases with microchannel depth. When combining the steps of wire EDM with subsequent liquid chemical etching, it may be advantageous to fabricate the microchannels and fins with thicknesses that are constant with microchannel depth. When liquid etching results in substantially uniform material removal rates, then a constant-thickness fin might largely maintain a constant thickness during and at the conclusion of the etching process. On the other hand, a fin which is much thinner at the top than at the bottom of the microchannel, may lose material at the top during the etching process and the fin may end up being shorter, which may be undesirable.

A microchannel heat exchanger core may be formed by assembling and joining panels having microchannels and fins by arranging the panels one on top of the other, with optional parting sheets disposed between each panel. The panels may be joined with tightness against leaks by brazing, welding or gasketing. In one illustrative embodiment, using panels with fins on opposite sides of each panel may reduce the total number of parts which need to be assembled by approximately 50% and thus may enable approximately 50% fewer joints, increasing mechanical strength, leak tightness and yield and reducing cost.

The following examples illustrate high aspect ratio microchannel and fin geometries of panels fabricated in aluminum alloy 6061 by wire EDM in water according to the present invention.

EXAMPLE 1

An aluminum 6061 alloy panel was fabricated having 40 microchannels or fins per inch. The microchannels had a depth of 0.45 inches, a width of 0.0168 inches and a length of 1.00 inch. The microchannels were straight, parallel passages with bottom round radii of 0.008 to 0.009 inches, separated by 0.0079 inch thick fins, and having an aspect ratio of 27.

EXAMPLE 2

An aluminum 6061 alloy panel was fabricated having 40 microchannels or fins per inch. The microchannels had a depth of 0.45 inches, a width of 0.0179 inches and a length of 1.00 inch. The microchannels were straight, parallel passages with bottom round radii of 0.008 to 0.009 inches, separated by 0.0073 inch thick fins, and having an aspect ratio of 25.

EXAMPLE 3

An aluminum 6061 alloy panel was fabricated having 40 microchannels or fins per inch. The microchannels had a depth of 0.45 inches, a width of 0.0197 inches and a length of 1.00 inch. The microchannels were straight parallel passages with bottom round radii of 0.008 to 0.009 inches, separated by 0.0047 to 0.0054 inch thick fins, and having an aspect ratio of 23.

EXAMPLE 4

An aluminum 6061 alloy panel was fabricated having 40 microchannels or fins per inch using 0.010 inch diameter wire electrode. The microchannels had a depth of 0.45 inches, a width of 0.0162 inches and a length of 4.00 inches. The microchannels were straight, parallel passages with bottom round radii of 0.010 inch, separated by 0.009 inch thick fins, and having an aspect ratio of over 27. Ten such parallel microchannels were fabricated over a 0.25 inch wide region, which equaled 40 fins per inch. Both passage widths and fin thicknesses were measured to be constant as a function of passage depth.

EXAMPLE 5

An aluminum 6061 alloy panel was fabricated having 60 microchannels or fins per inch. The microchannels had a depth of 0.25 inches, a width of 0.0145 inches and a length of 1.00 inch. The microchannels were straight, parallel passages with bottom round radii of 0.006 inch, separated by 0.002-0.003 inch thick fins, and having an aspect ratio of over 17. Ten such parallel microchannels were fabricated over a 0.167 inch wide region which equaled 60 fins per inch.

EXAMPLE 6

An aluminum 6061 alloy panel was fabricated having 70 microchannels or fins per inch. The microchannels had a depth of 0.15 inches, a width of 0.011 inches and a length of 1.00 inch. The microchannels were straight, parallel passages with bottom round radii of 0.008 inch, separated by 0.0018-0.0025 inch thick fins, and having an aspect ratio of over 12. Ten such parallel passages were fabricated over a 0.14 inch wide region, which equaled 70 fins per inch.

EXAMPLE 7

An aluminum 6061 alloy panel was fabricated having 76 microchannels or fins per inch using 0.006 inch diameter wire electrode powered during plunge-in only. The microchannels had a depth of 0.133 inches, a width of 0.009 inches and a length of 4.00 inches. The microchannels were straight, parallel passages with bottom round radii of 0.005 inch, separated by 0.0035-0.0043 inch thick fins, and having an aspect ratio of over 14.6. Ten such parallel passages were fabricated over a 0.13 inch wide region, which equaled 76 fins per inch.

It should be understood, of course, that the foregoing relates to exemplary embodiments of the invention and that modifications may be made without departing from the spirit and scope of the invention as set forth in the following claims.

I claim:

1. A method of making a microchannel heat exchanger core comprising the steps of:
   performing electrical discharge machining of a plurality of microchannels and fins on at least two panels using an electrode to provide machined panels, wherein the fins separate the microchannels by providing walls for the microchannels and wherein the microchannels have an aspect ratio of depth to width of at least about 10;
   etching the microchannels of the machined panels;
   arranging the machined panels one on top of the other; and
   joining the machined panels together by brazing, welding or gasketing;
   wherein the step of performing electrical discharge machining comprises:
   applying a first voltage to an electrode;
   moving the electrode downward into one side of the panel to a desired depth to form a microchannel;
   changing a voltage applied to the electrode to a second voltage after the desired depth is reached;
   moving the electrode sideways by a predetermined amount; and
   changing a voltage applied to the electrode to zero voltage as the electrode is moved upward out of the panel.

2. The method of claim 1 further comprising the step of placing a parting sheet between the machined panels before they are joined.

3. The method of claim 1 wherein the electrode is a wire having a diameter from about 0.001 inches to about 0.012 inches.

4. The method of claim 1 wherein the electrode is a rod.

5. The method of claim 4 wherein the rod has a round, elliptical, square, rectangular or triangular cross-section.

6. The method of claim 4 wherein the rod has a round cross-section with a diameter of from about 0.008 inches to about 0.010 inches.

7. The method of claim 1 wherein the at least one electrode comprises an array of electrodes.

8. The method of claim 1 wherein the etching is chemical etching or electrochemical etching.

9. The method of claim 1 wherein a dilute acid or base is used for the etching.

10. The method of claim 1 wherein a dilute solution of potassium hydroxide having a concentration of about 5% to about 20% by weight is used for the etching.

11. The method of claim 1 wherein from about 40 to about 80 fins per inch are machined into the panel.

12. The method of claim 1 wherein the panel comprises an aluminum alloy, a titanium alloy, an iridium alloy, a rhodium alloy, an aluminum-silicon carbide composite, titanium carbide or titanium nitride.

* * * * *